(12) United States Patent
Im et al.

(10) Patent No.: US 9,997,669 B2
(45) Date of Patent: Jun. 12, 2018

(54) HIGH POWER LIGHT EMITTING DEVICE AND METHOD OF MAKING THE SAME

(71) Applicants: Seoul Viosys Co., Ltd., Ansan-si (KR); Seoul Semiconductor Co., Ltd., Ansan-si (KR)

(72) Inventors: Chang Ik Im, Ansan-si (KR); Motonobu Takeya, Ansan-si (KR); Chung Hoon Lee, Ansan-si (KR); Michael Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days. days.

(21) Appl. No.: 14/820,509

(22) Filed: Aug. 6, 2015

(65) Prior Publication Data

US 2016/0043276 A1 Feb. 11, 2016

(30) Foreign Application Priority Data

Aug. 6, 2014 (KR) .................. 10-2014-0101156

(51) Int. Cl.
*H01L 33/00* (2010.01)
*H01L 33/18* (2010.01)
(Continued)

(52) U.S. Cl.
CPC .......... *H01L 33/18* (2013.01); *H01L 33/0025* (2013.01); *H01L 33/06* (2013.01); *H01L 33/32* (2013.01); *H01L 33/382* (2013.01); *H01L 33/405* (2013.01); *H01L 33/504* (2013.01); *H01L 33/505* (2013.01); *H01L 33/507* (2013.01); *H01L 33/54* (2013.01); *H01L 33/60* (2013.01); *H01L 33/62* (2013.01); *H01L 33/642* (2013.01); *H01L 33/647* (2013.01); (Continued)

(58) Field of Classification Search
CPC ....... H01L 33/18; H01L 33/647; H01L 33/62; H01L 33/32; H01L 33/0025; H01L 33/06; H01L 33/507; H01L 33/505; H01L 33/642; H01L 33/54; H01L 33/504; H01L 33/405; H01L 33/382; H01L 33/60
See application file for complete search history.

(56) References Cited

U.S. PATENT DOCUMENTS

2006/0054076 A1* 3/2006 Dwilinski ................. C30B 7/00
117/3
2012/0018764 A1* 1/2012 Choi ......................... H01L 33/20
257/99

(Continued)

*Primary Examiner* — Victor A Mandala
(74) *Attorney, Agent, or Firm* — Perkins Coie LLP (57) ABSTRACT

Disclosed herein are a light emitting device and a method of making the same. The light emitting device includes: a substrate including a first lead and a second lead; a light emitting diode disposed over the first lead of the substrate, including a second conductive-type semiconductor layer, an active layer, and a first conductive-type semiconductor layer, and emit near ultraviolet light; and a wavelength conversion unit disposed over the light emitting diode and spaced apart from the light emitting diode, wherein the light emitting structure has semi-polar or non-polar characteristics, the wavelength conversion unit has a multi-layered structure including a first phosphor layer and a second phosphor layer, and the light emitting diode is driven at a current density which is equal to or greater than 350 mA/mm².

20 Claims, 7 Drawing Sheets

(51) Int. Cl.
*H01L 33/06* (2010.01)
*H01L 33/32* (2010.01)
*H01L 33/50* (2010.01)
*H01L 33/38* (2010.01)
*H01L 33/40* (2010.01)
*H01L 33/60* (2010.01)
*H01L 33/54* (2010.01)
*H01L 33/62* (2010.01)
*H01L 33/64* (2010.01)

(52) U.S. Cl.
CPC ............... *H01L 2224/48091* (2013.01); *H01L 2224/48227* (2013.01); *H01L 2224/48247* (2013.01); *H01L 2224/73265* (2013.01); *H01L 2224/8592* (2013.01); *H01L 2924/181* (2013.01)

(56) References Cited

U.S. PATENT DOCUMENTS

2014/0284649 A1* 9/2014 Baumgartner ..... C09K 11/7734
257/98
2015/0221843 A1* 8/2015 Choi ....................... H01L 33/20
257/98

* cited by examiner

HIGH POWER LIGHT EMITTING DEVICE AND METHOD OF MAKING THE SAME

PRIORITY CLAIMS AND CROSS-REFERENCE TO RELATED APPLICATION

This patent document claims priority and benefits of Korean Patent Application No. 10-2014-0101156, filed on Aug. 6, 2014, the contents of which are incorporated by reference herein in its entirety.

TECHNICAL FIELD

The disclosure of this patent document relates to a high power light emitting device and a method of making the same, which is capable of preventing efficiency drop and a deterioration of a wavelength conversion unit when being operated at a high current density.

BACKGROUND

A light emitting diode has been applied to various light source applications. In particular, a light emitting diode made of nitride based semiconductor has been widely used.

Recently, with the growing demand for a high power light emitting diode, a demand for a vertical light emitting diode having excellent heat sink efficiency and high light emitting efficiency has been increased. The vertical light emitting diode separates a growth substrate from a semiconductor layer to increase roughness of a separated surface, to thereby increase light extraction efficiency. Further, the vertical light emitting diode attaches a metal substrate over the whole surface of a P type semiconductor layer to increase the heat sink efficiency. Therefore, the vertical light emitting diode can be applied to the high power light emitting diode which is driven at a high current density.

SUMMARY

The present disclosure is to provide a high power light emitting device and a method of making the same, which has excellent efficiency, reliability, and light emitting characteristics when being driven at a high density current.

According to some exemplary embodiments of the present disclosure, a light emitting device is provided to includes: a substrate including a first lead and a second lead; a light emitting diode including a light emitting structure including an active layer, a first conductive-type semiconductor layer disposed over the active layer, disposed on the first lead of the substrate, include and a second conductive-type semiconductor layer, the active layer disposed over the second conductive type semiconductor layer an active layer disposed on the second conductive-type semiconductor layer, and a first conductive-type semiconductor layer disposed on the active layer, wherein the light emitting diode is configured to and emit near ultraviolet light; and a wavelength conversion unit disposed on the light emitting diode, wherein the light emitting diode includes at least one groove formed in the light emitting structure and exposing a portion of the first conductive-type semiconductor layer; a first electrode disposed under the light emitting structure and electrically connected to the first conductive-type semiconductor layer exposed by the at least one groove; and a second electrode disposed under a lower surface of the second conductive-type semiconductor layer and at least partially covered by the second conductive-type semiconductor layer, and wherein the light emitting diode has a semi-polar or non-polar growth surface, the wavelength conversion unit has includes a multilayered structure including a first phosphor layer and a second phosphor layer disposed on over the first phosphor layer, and the light emitting diode is configured to be driven at a current density which is equal to or greater than 350 mA/mm$^2$.

With the configuration above, it is possible to provide the high power light emitting device which can be driven at a high current density, have with excellent reliability, and uniformly emit light to have excellent light emitting characteristics.

In some implementations, the first conductive-type semiconductor layer, the second conductive-type semiconductor layer, and the active layer can include a nitride based semiconductor layer and the nitride based semiconductor layer can have a growth surface which is including an m-plane, an a-plane, or a semi-polar crystal plane. The light emitting diode can include: at least one groove formed in a lower surface of the light emitting structure and exposing a portion of the first conductive-type semiconductor layer; a first electrode configured to be electrically connected to the first conductive-type semiconductor layer exposed to the at least one groove and to be disposed under the light emitting structure; and a second electrode disposed on a lower surface of the second conductive-type semiconductor layer and have an upper surface partially exposed.

In some implementations, the light emitting diode can further include a second electrode pad which is disposed on over a region to which of the second electrode not covered by the second conductive-type semiconductor layer is exposed.

In some implementations, the first electrode can be electrically connected to the first lead and the second lead can be electrically connected to the second electrode pad.

In some implementations, the second electrode can include a reflective layer and a cover layer covering the reflective layer and a part of the second electrode not covered by the second conductive-type semiconductor layer partially exposed can be forms a part of the cover layer.

In some implementations, the active layer can emit light having a peak wavelength which ranges from 380 to 420 nm.

In some implementations, the first phosphor layer can include a red phosphor and the second phosphor layer can include a cyan phosphor.

In some implementations, the first phosphor layer can have an upper surface including a plurality of protrusions and depressions.

In some implementations, the wavelength conversion unit can further include a third phosphor layer which is disposed on over the second phosphor layer and the first to third phosphor layers can each include a red phosphor, a green phosphor, and a blue phosphor, respectively.

In some implementations, the first phosphor layer, and/or the second phosphor layer, or both of the first and second phosphor layers can have include a plurality of protrusions and depressions formed on an upper surface thereof.

In some implementations, the light emitting device can further include: a reflector disposed on over the substrate and enclose surrounding a side of the light emitting diode, wherein the wavelength conversion unit has a plate form shape and is supported by the reflector.

In some implementations, the wavelength conversion unit can be spaced apart from the light emitting diode by and a spaced distance from an upper surface of the light emitting diode to a lower surface of the wavelength conversion unit can be that is 0.5 to 5.0 times as great as a thickness of the light emitting diode.

In some implementations, the light emitting device can further include: an encapsulation unit covering the light emitting diode, wherein the wavelength conversion unit is disposed on over the encapsulation unit.

In some implementations, the substrate can further include an upper insulating substrate and a lower insulating substrate, the first lead can include a first upper conductive pattern, a first intermediate conductive pattern, a first lower conductive pattern, a first upper via, and a first lower via, the second lead can include a second upper conductive pattern, a second intermediate conductive pattern, a second lower conductive pattern, a second upper via, and a second lower via, the first upper conductive pattern and the second upper conductive pattern can be disposed on over the upper insulating substrate, and being spaced apart from each other, the first intermediate conductive pattern and the second intermediate conductive pattern can be interposed between the upper insulating substrate and the lower insulating substrate, and being spaced apart from each other, and the first lower conductive pattern and the second lower conductive pattern can be disposed under a lower surface of the lower insulating substrate, the first upper via and the first lower via can each penetrate through the upper insulating substrate and the lower insulating substrate, respectively, to form an electrically connection among the first upper conductive pattern, the first intermediate conductive pattern, and the first lower conductive pattern, and the second upper via and the second lower via can each penetrate through the upper insulating substrate and the lower insulating substrate, respectively, to form an electrically connection among the second upper conductive pattern, the second intermediate conductive pattern, and the second lower conductive pattern.

In some implementations, the substrate can further include a heat sink lead, the heat sink lead can include an upper heat sink pattern, a lower heat sink pattern, and a heat sink via, and the upper heat sink pattern can be interposed between the upper insulating substrate and the lower insulating substrate, the lower heat sink pattern can be disposed under the lower surface of the lower insulating substrate, and the heat sink via can penetrate through the lower insulating substrate to form a thermally connection between the upper heat sink pattern and the lower heat sink pattern.

In some implementations, the light emitting device can further include: a resin unit covering a side of the light emitting diode.

In some implementations, the light emitting device can further include: a light transmitting layer at least partially covering the light emitting diode, wherein the wavelength conversion unit is disposed on over the light transmitting layer to be and spaced apart from the light emitting diode.

In some implementations, the at least one groove has an inclined side.

In some implementations, the first electrode is disposed under the light emitting structure and extends under the second electrode pad.

In some implementations, the light emitting device further includes an insulating layer disposed between first electrode and the second electrode.

DETAILED DESCRIPTION OF EXEMPLARY EMBODIMENTS

Hereinafter, exemplary embodiments of the present disclosure will be described in detail with reference to the accompanying drawings. Exemplary embodiments to be provided below are provided by way of example to facilitate the understanding of various implementations of the disclosed technology. Therefore, the present disclosure is not limited to exemplary embodiments to be described below, but can be implemented in other forms. In the accompanying drawings, widths, lengths, thicknesses, or the like, of components can be exaggerated for convenience. In addition, the case in which it is represented that one component is "on an upper portion of" or "above" another component is intended to include not only the case in which each part is "directly on an upper portion of" or "directly above" another part but also the case in which the other part is between each part and another part. Like reference numerals denote like components throughout the present specification.

Some nitride-based vertical light emitting diodes are manufactured by being grown on the growth substrate having the growth surface of a C surface. However, the growth surface of the C surface has polarity and therefore spontaneous polarization and piezoelectric polarization are generated on the grown nitride based semiconductor layer such that quantum efficiency inside the light emitting diode is reduced and the efficiency drop occurs. To address the problems, a method of making a vertical light emitting diode using a non-polar or semi-polar growth substrate has been proposed. The light emitting diode having non-polar or semi-polar characteristics can be driven at a higher current than the existing light emitting diode grown on the C surface and has the relatively reduced efficiency drop and heat generation.

Light emitted by driving the light emitting diode grown along the non-polar or semi-polar growth surface is polarized.

When the light emitting diode of which the emission has the polarization characteristics is used as the light source, reflectance from a surface of an object on which light is incident is different depending on a kind of polarizations. For example, the reflectance from the surface of the object on which the light is incident is different depending on P polarized light and S polarized light. In applications using the polarization characteristics, it is important to improve a degree of polarization, but in a lighting purpose, when a lighting device has polarization, uniformity of light emitted from the lighting device deteriorates, and as a result, performance of the lighting device is degraded. In particular, in the case of the light emitting device for the lighting purpose which emits the high power light, the non-uniformity of light due to the polarization becomes more noticeable.

Therefore, a need exists for the light emitting device which is driven at the high density current to have the high output and has the excellent efficiency and the uniform light emitting characteristics.

FIGS. 1 to 9 are plan views and cross-sectional views for describing a light emitting diode and a method of making the same according to some exemplary embodiments of the present disclosure.

Figure 1:
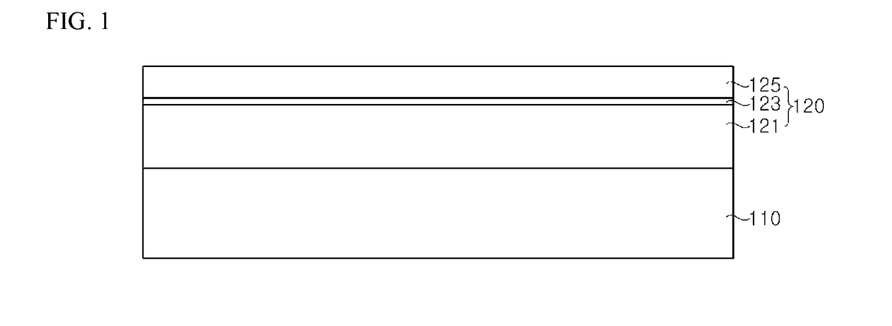
FIGS. 1 to 9 are plan views and cross-sectional views for describing an exemplary light emitting diode and an exemplary method of making the same according to some exemplary embodiments of the present disclosure.

Referring to FIG. 1, a light emitting structure 120 is formed on a growth substrate 110.

As long as the growth substrate 110 is a substrate on which the light emitting structure 120 can be grown, any substrate can be used as the growth substrate. For example, the growth substrate 110 can include a sapphire substrate, a silicon carbide substrate, a silicon substrate, or a nitride based substrate including nitride semiconductor such as (Al, Ga, and In) N. Further, the growth substrate 110 has a non-polar or semi-polar growth surface.

According to the exemplary embodiment of the present disclosure, the growth substrate 110 can be or include the nitride-based substrate having at least one of family planes {1-100} of an m-plane or at least one of family planes {11-20} of an a-plane as the growth surface. In some implementations, the growth substrate 110 can be or include the semi-polar nitride based substrate having a plane like (1122) (however, not limited thereto) as the growth surface. Further, the growth surface of the growth substrate 110 can also have a predetermined off-cut angle from a non-polar or semi-polar crystal plane.

The growth substrate 110 according to the exemplary embodiment of the present disclosure is not limited to the foregoing nitride based substrate. For example, the growth substrate 110 can be or include a substrate on which a semi-polar or non-polar nitride based semiconductor layer can be grown, among heterogeneous substrates like a sapphire substrate. For example, the growth substrate 110 can also be or include an r-plane sapphire substrate, an m-plane sapphire substrate, or an a-plane sapphire substrate.

The forming of the light emitting structure 120 can include forming a first conductive-type semiconductor layer 121, an active layer 123, and a second conductive-type semiconductor layer 125.

The first conductive-type semiconductor layer 121, the active layer 123, and the second conductive-type semiconductor layer 125 can be grown on the growth substrate 110 using technologies such as metal organic chemical vapor deposition (MOCVD), molecular beam epitaxy (MBE), or hydride vapor phase epitaxy (HVPE).

The first conductive-type semiconductor layer 121 and the second conductive-type semiconductor layer 125 can include III-V based compound semiconductor and can include, for example, the nitride based semiconductor such as (Al, Ga, In) N. The first conductive-type semiconductor layer 121 can include an n type impurity (for example, Si) and the second conductive-type semiconductor layer 125 can include a p type impurity (for example, Mg). In some implementations, the first conductive-type semiconductor layer 121 can include a p type impurity (for example, Mg) and the second conductive-type semiconductor layer 125 can include an n type impurity (for example, Si). The first conductive-type semiconductor layer 121 and/or the second conductive-type semiconductor layer 125 can be a single layer and can also include multiple layers. For example, the first conductive-type semiconductor layer 121 and/or the second conductive-type semiconductor layer 125 can include a clad layer and a contact layer and can also include a supper lattice layer.

The active layer 123 can include the nitride based semiconductor such as (Al, Ga, In) N and the composition of the active layer 123 can be determined depending on a desired peak wavelength of light. Further, the active layer 123 can include a multiple quantum well (MQW) structure. According to the exemplary embodiment of the present disclosure, the light emitted from the active layer 123 can include ultraviolet light and near ultraviolet light and a peak wavelength of the emitted light can range for example, from 380 to 420 nm.

The first conductive-type semiconductor layer 121, the active layer 123, and the second conductive-type semiconductor layer 125 can be grown along the crystal plane of the growth surface of the growth substrate 110, and thus can have the non-polar or semi-polar characteristics. That is, the first conductive-type semiconductor layer 121, the active layer 123, and the second conductive-type semiconductor layer 125 can have the growth surfaces of the a-plane or the m-plane and can also have the non-polar growth surface like plane (1122). The semiconductor layers 121, 123, and 125 have the non-polar or semi-polar characteristics, thereby improving internal quantum efficiency of the light emitting diode, reducing efficiency droop of the light emitting diode, and relatively reducing heat generation at the time of light emission.

Figure 2:
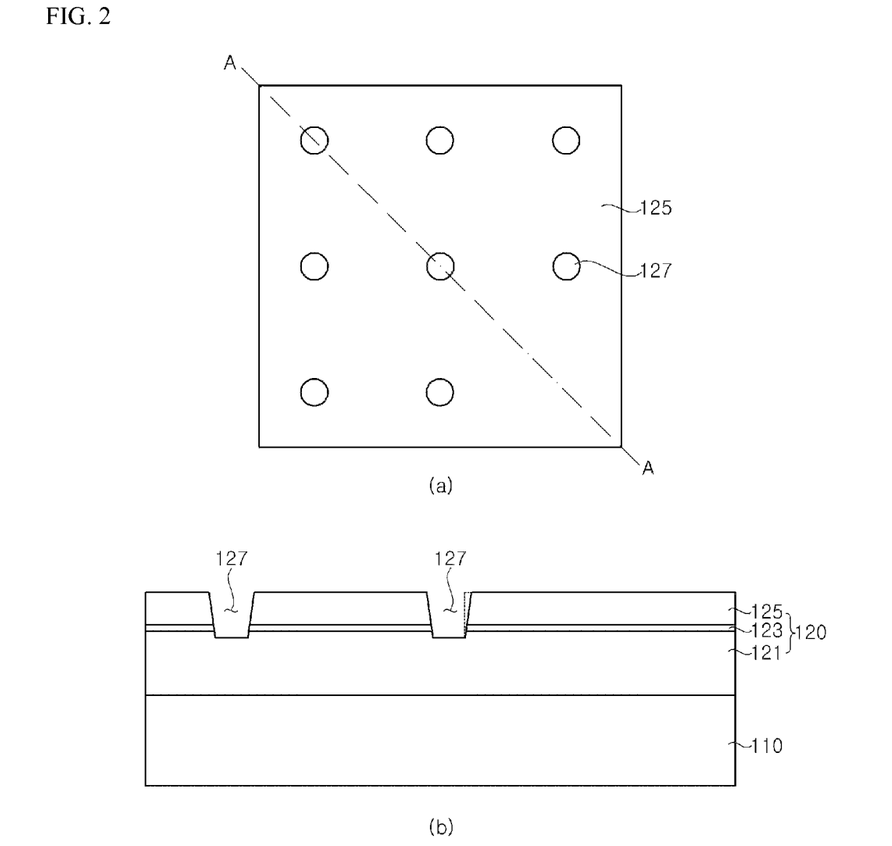

Referring to FIG. 2, at least one groove 127 exposing the first conductive-type semiconductor layer 121 is formed by partially removing the light emitting structure 120. FIG. 2, top figure (a) is a plan view illustrating an upper surface of the light emitting structure 120 and FIG. 2, bottom figure (b) is a cross-sectional view of a part taken by the line A-A of FIG. 2, top figure (a).

At least one groove 127 can be formed by patterning the light emitting structure 120 using a photolithography technology and a side of the second conductive-type semiconductor layer 125, a side of the active layer 123, and the upper surface of the first conductive-type semiconductor layer 121 can be partially exposed inside at least one groove 127. The side of at least one groove 127 can be inclined and as illustrated, an angle of inclination of the side of at least one groove 127 can be an angle smaller than 90° (illustrated by a dotted line).

As illustrated, a plurality of grooves 127 can be formed and disposed in the light emitting structure 120 in various forms. As illustrated, the plurality of grooves 127 can also be formed to have a constant pitch interval in a dot form. In some implementations, the plurality of grooves 127 can be formed in a plurality of stripe forms or can also be formed in a mixed form of the dot form and the stripe form. When the plurality of grooves 127 are formed, the plurality of grooves 127 can be formed across a whole upper surface of the light emitting structure 120. Therefore, as described below, current spreading efficiency or performance can be improved while driving the light emitting diode.

Figure 3:
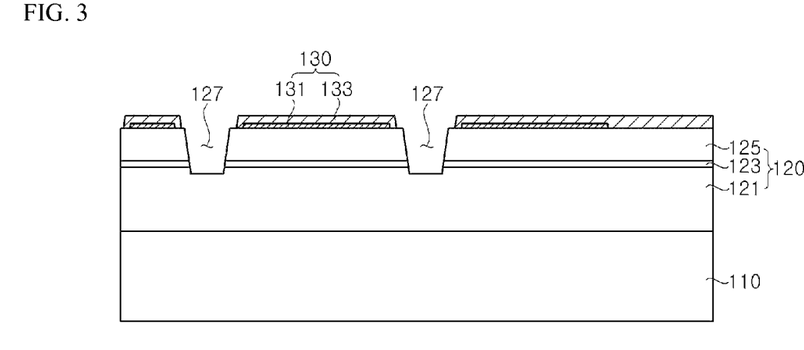

Referring to FIG. 3, a second electrode 130 is formed on the second conductive-type semiconductor layer 125.

The second electrode 130 can at least partially cover the upper surface of the second conductive-type semiconductor layer 125 and can be electrically connected to the second conductive-type semiconductor layer 125. In some implementations, the second electrode 130 can be disposed on a region in which at least one groove 127 is not formed.

Further, the second electrode 130 can include a reflective layer 131 and a cover layer 133 covering the reflective layer 131.

The reflective layer 131 can serve to reflect light and can serve as a kind of electrode which is electrically connected to the second conductive-type semiconductor layer 125. Therefore, the reflective layer 131 can include metal which can form an ohmic contact with the second conductive-type semiconductor layer 125, while having high reflectance. For example, the reflective layer 131 can include at least one of Ni, Pt, Pd, Rh, W, Ti, Al, Ag, or Au. Further, the reflective metal layer 131 can include a single layer or multiple layers. The reflective layer 131 can be disposed on a region of the upper surface of the second conductive-type semiconductor layer 125, where at least one groove 127 is not formed. Further, the reflective layer 131 can be formed to have an area smaller than that of the upper surface of the second conductive-type semiconductor layer 125.

In some implementations, a particular region exists on the upper surface of the second conductive-type semiconductor layer 125, where the reflective layer 131 is not formed. The particular region can be defined as a region for forming a second electrode pad 180, which will be described later in detail.

The cover layer 133 can cover an upper surface and a side of the reflective layer 131. The cover layer 133 can prevent a mutual diffusion with other materials different from those of the reflective layer 131, thereby preventing the reflective layer 131 from being damaged due to the diffusion of other materials to the reflective layer 131 from the outside. The cover layer 133 can be integrally formed over most or the whole of the light emitting diode and can include at least one opening corresponding to at least one groove 127.

Further, the cover layer 133 can also be formed on some regions on the upper surface of the second conductive-type semiconductor layer 125, where the reflective layer 131 is not formed. The second electrode pad 180 can be formed on a part corresponding to the region in which the reflective layer 131 is not formed and only the cover layer 133 is formed. This will be described below in detail.

The cover layer 133 can be electrically connected to the second conductive-type semiconductor layer 125 along with the reflective layer 131 and can serve as a kind of electrode along with the reflective layer 131. The cover layer 133 can include at least one of, for example, Au, Ni, Ti, or Cr and can also include a single layer or multiple layers.

As described above, the second electrode 130 can include metal and can be formed by depositing and/or plating metal. When the second electrode 130 includes multiple layers, each layer is stacked and thus the second electrode 130 having multi-layered structure can be provided.

While it has been described that the second electrode is formed after at least one groove 127 is formed, the disclosed technology is not limited thereto. Thus, in some implementations, the second electrode 130 is first formed and then at least one groove 127 can be formed.

Figure 4:
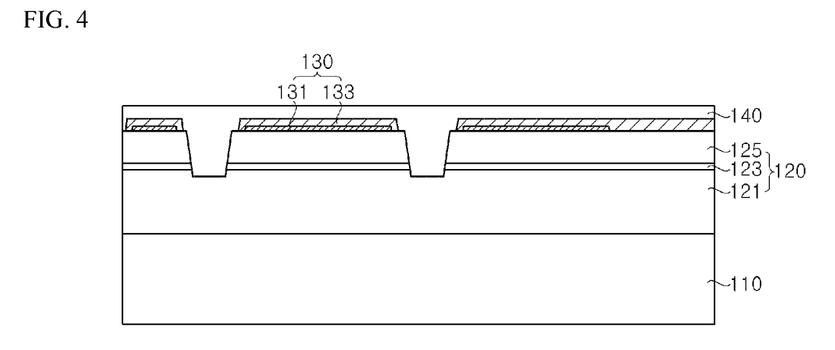

Referring to FIG. 4, an insulating layer 140 covering the second electrode 130 and at least one groove 127 can be formed over the light emitting structure 120. In some implementations, the insulating layer 140 can fill at least one groove 127 to cover the side of the groove 127.

The insulating layer 140 can include $SiN_x$, or $SiO_2$, etc., and can be formed using, for example, electron-beam evaporation, or available deposition technologies, and the like. The insulating layer 140 can be formed of multiple layers, for example, and can also include a distribution Bragg reflector in which dielectric layers having different refractive indexes are stacked. When the insulating layer 140 includes the distribution Bragg reflector, light toward a region which is not covered with the second electrode 130 can be reflected, and thus the light emitting efficiency of the light emitting diode can be more improved.

Figure 5:
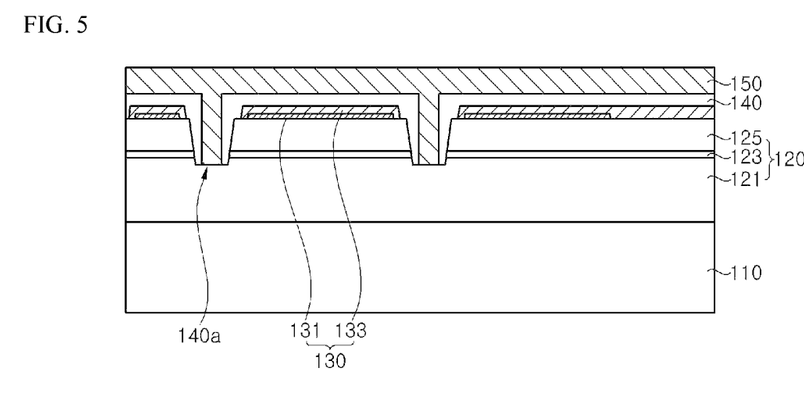

Referring to FIG. 5, the first electrode 150 is disposed over the light emitting structure 120 and is electrically connected to the first conductive-type semiconductor layer 121.

The forming of the first electrode 150 can include forming at least one opening 140a exposing the first conductive-type semiconductor layer 121 and forming a first electrode covering the at least one opening 140a and the insulating layer 140. The at least one opening 140a is formed in the corresponding region to at least one groove 127 by partially removing the insulating layer. In this case, the side of at least one groove 127 is covered with the insulating layer 140 such that the first electrode 150 and the sides of the second conductive-type semiconductor layer 125 and the active layer 123 can be prevented from being electrically connected.

When a plurality of grooves 127 are formed across most or the whole surface of the light emitting structure 120, the first electrode 150 generally uniformly contacts the first conductive-type semiconductor layer 121. Therefore, the current spreading efficiency or performance of the light emitting diode can be improved.

The first electrode 150 includes the part filling at least one opening 140a of the insulating layer 140 and the part covering the upper surface of the insulating layer 140. These two parts of the first electrode 150 can be separately formed from each other or integrally be formed by a single process. When the part filling at least one opening 140a and the part covering the upper surface of the insulating layer 140 are separately formed, the two parts can include different materials from each other.

The first electrode 150 can include a material which can be electrically connected to the first conductive-type semiconductor layer 121. In some implementations, the first electrode 150 can include a metal material which can form an ohmic contact with the first conductive-type semiconductor layer 121. Further, the first electrode 150 can include a metal material having high reflectance with respect to ultraviolet light. For example, the first electrode 150 can include Ti, Ni, Au, Ag, Al, or Cu, and the like. When the part filling at least one opening 140a of the insulating layer 140 and the part covering the upper surface of the insulating layer 140 include different materials, the part filling at least one opening 140a can include a metal material which can form the ohmic contact with the first conductive-type semiconductor layer 121 and the part covering the upper surface of the insulating layer 140 can include the high reflective metal material.

At least one opening 140a of the insulating layer 150 can be formed by the photolithography process and the first electrode 140 can be formed using deposition and lift off technology, etc.

Figure 6:
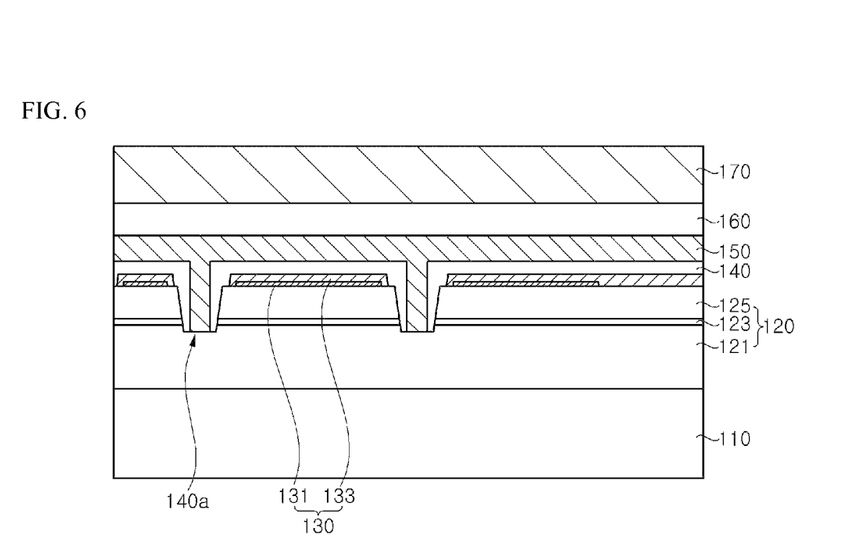

Referring to FIG. 6, a support substrate 170 is formed on the light emitting structure 120 and a bonding layer 160 can be further formed between the support substrate 170 and the first electrode 150.

The bonding layer 160 can be interposed to bond the support substrate 170 to the first electrode 150. Various implementations can be made for the bonding layer 160 as long as the support substrate 170 can be bonded to the first electrode 150. For example, the eutectic bonding can be performed using AuSn to bond the first electrode 150 to the support substrate 170, and thus the bonding layer 160 can include AuSn. The eutectic bonding using the AuSn can be performed by heating AuSn at a temperature (for example, about 350° C.) which is equal to or greater than an eutectic temperature (about 280° C.) of AuSn, disposing the heated AuSn between the first electrode 150 and the support substrate 170, then cooling AuSn.

Further, the bonding layer 160 can electrically connect the first electrode 150 to the support substrate 170 and thus the support substrate 170 and the first conductive-type semiconductor layer 121 can be electrically connected to each other. In this case, the support substrate 170 can serve as an electrode pad which is electrically connected to the first electrode 150. When the support substrate 170 serves as the electrode pad, the support substrate 170 is bonded to an extra secondary substrate, and thus the light emitting diode can be mounted on the separate secondary substrate. In this case, the support substrate 170 is formed over the whole surface of the light emitting diode, and therefore can effectively conduct heat to the secondary substrate, which is generated during the driving of the light emitting diode. Therefore, even though being driven at a high current, the light emitting diode according to the exemplary embodiment of the present disclosure can effectively emit heat and thus has excellent reliability.

Figure 7:
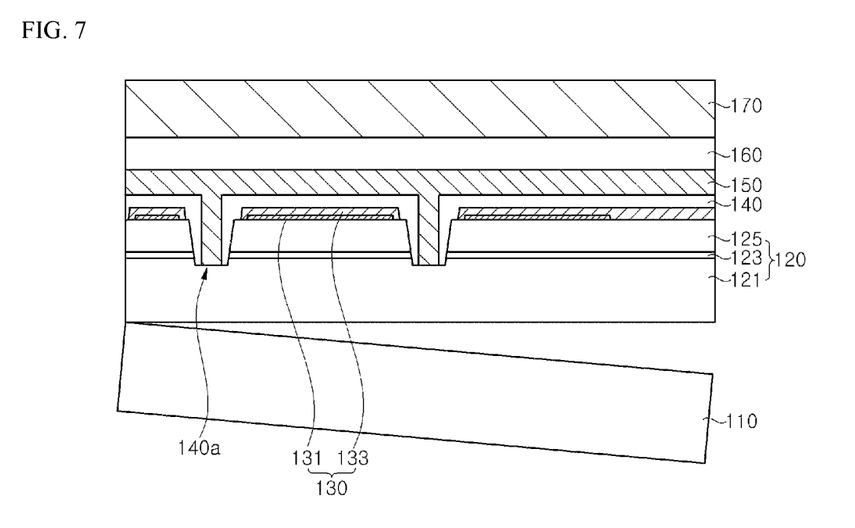

Referring to FIG. 7, the growth substrate 110 is separated from the light emitting structure 120.

The growth substrate 110 can be removed by various methods such as a laser lift off, a chemical lift off, or a stress lift off. Additional layers can be further interposed between the light emitting structure 120 and the growth substrate 110 according to the method for removing the growth substrate 110. For example, when the growth substrate 110 is the same kind of nitride substrate as the light emitting structure 120, a sacrificial layer (not illustrated) can be further interposed between the growth substrate 110 and the light emitting structure 120. In this case, the growth substrate 110 can be separated from the light emitting structure 120 by chemically removing a portion of the sacrifice layer and the growth substrate 110 can also be separated from the light emitting structure 120 by applying a stress to the sacrifice layer. However, the present disclosure is not limited thereto and other implementations are also possible.

Figure 8:
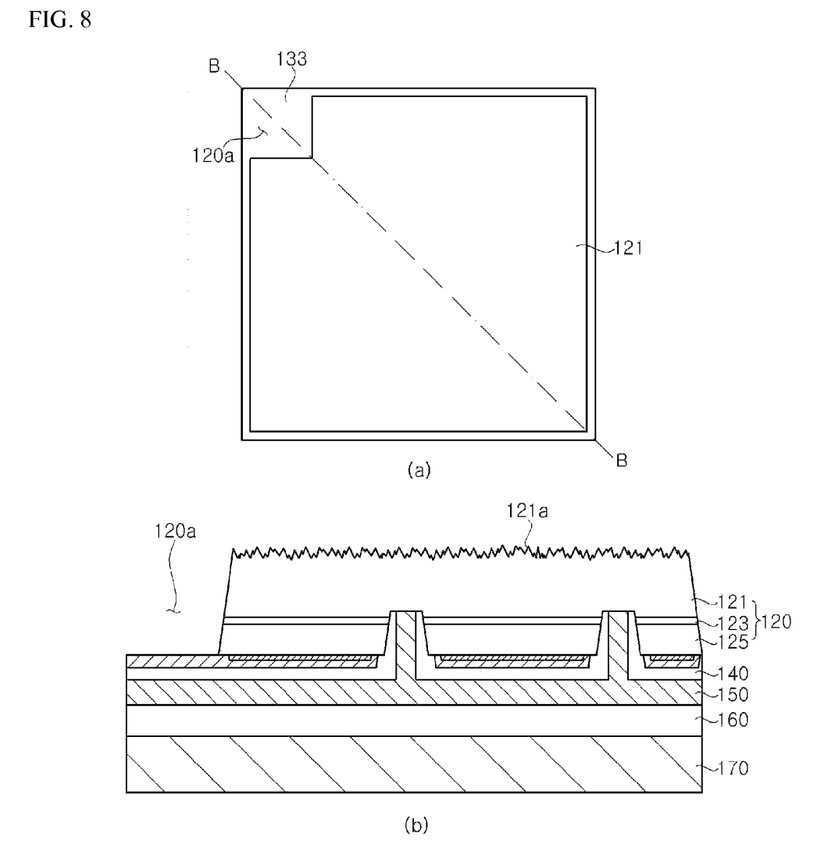

Next, FIG. 8, top figure (a) is a plan view illustrating the upper surface of the light emitting structure 120 and FIG. 8, bottom figure (b) is a cross-sectional view of a part taken along the line B-B in FIG. 8, top figure (a). Referring to FIG. 8, by partially removing the light emitting structure 120, a portion of the second electrode 130 may be exposed. For example, the region 120a is formed to expose the cover layer 133. Further, a roughness 121a may be formed on the surface exposed by separating the growth substrate 110 from the light emitting structure 120.

The region 120a in which the cover layer 133 is exposed can be formed by the photolithography process. Meanwhile, the forming of the roughness 121a on the upper surface of the first conductive-type semiconductor layer 121 can include performing wet and/or dry etching and can use, for example, photo-enhanced chemical (PEC) etching.

As described above, in the part in which the second electrode 130 is exposed, the reflective layer 131 is not exposed and only the cover layer 133 is exposed. Therefore, deterioration of reflective characteristics of the reflective layer 131 due to diffusion can be prevented.

Figure 9:
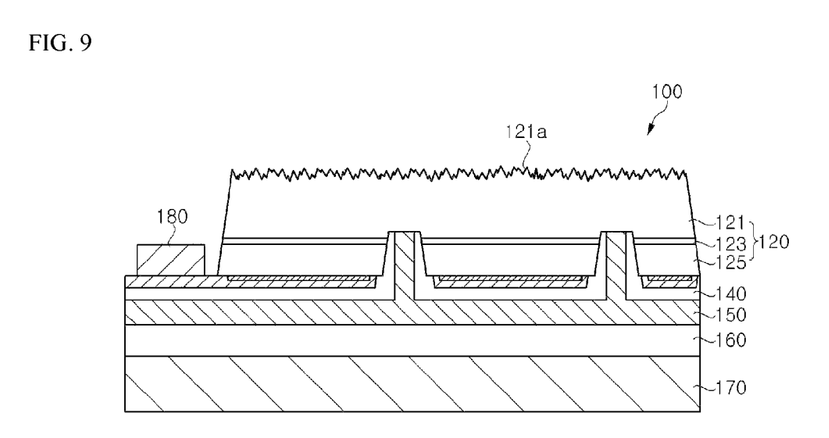

Referring to FIG. 9, the second electrode pad 180 is formed on the region 120a in which the cover layer 133 is exposed. The second electrode pad 180 can be formed using deposition and lift off technology and contact the cover layer 133 to be electrically connected to the reflective metal layer 131 through the cover layer 133. By doing so, the light emitting diode 100 as illustrated in FIG. 9 is provided.

Figure 10:
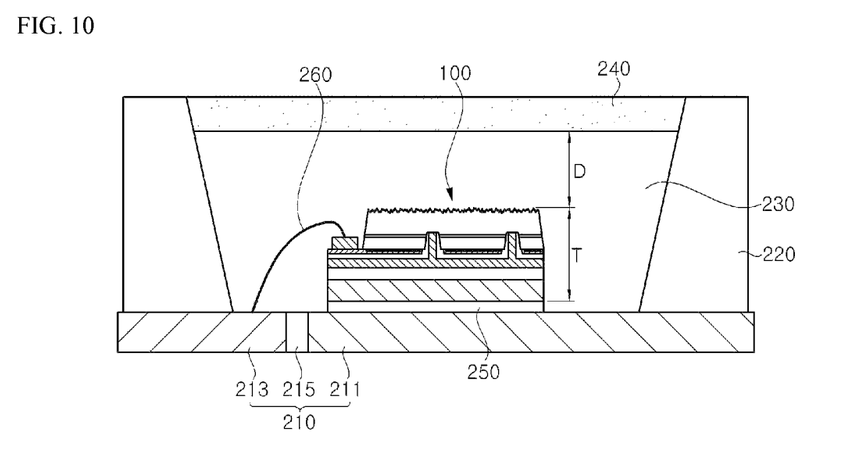
FIG. 10 is a cross-sectional view for describing an exemplary light emitting device and an exemplary method of making the same according to some exemplary embodiments of the present disclosure.

FIG. 10 is a cross-sectional view for describing a light emitting device and a method of making the same according to some exemplary embodiments of the present disclosure.

The light emitting device can be provided by preparing the light emitting diode, mounting the light emitting diode 100 on a substrate 210, and then forming a wavelength conversion unit 240 spaced apart from the light emitting diode 100. Hereinafter, each component or element and a making method will be described below.

The light emitting device includes the substrate 210, the light emitting diode 100, and the wavelength conversion unit 240. Further, the light emitting device can further include a reflector 220, an encapsulation unit 230, and a wire 260.

The substrate 210 can serve as a support plate on which the light emitting diode 100 can be mounted and can further serve to connect an external power supply to the light emitting diode 100. For example, the substrate 210 can include a first lead 211 and a second lead 213 and can further include an insulating part 215 which is positioned between the first and second leads 211 and 213 to insulate therebetween.

The first lead 211 and the second lead 213 can be spaced apart from each other and can be connected to the external power supply while having different polarities. Therefore, the first lead 211 and the second lead 213 can include a material having electrical conductivity and excellent heat conductivity and can include, for example, Al, Ag, Cu, or Ni, etc.

The reflector 220 can be disposed on the substrate 210 and can further include a cavity which is disposed along an outer edge of the substrate 210 to expose at least one of the first lead 211 and the second lead 213. An inner side of the reflector 220 can be inclined and a slope of the side can range from 30 to 60° with respect to the upper surface of the substrate 210.

The reflector 220 serves to reflect light emitted from the light emitting diode 100 to improve the light emitting efficiency of the light emitting device and therefore can include a material having high reflectance with respect to the emitted light. For example, the reflector 220 can include at least one of high reflective polymer like EMC, a high reflective ceramic material, or a high reflective metal material like Al and Ag.

In some implementations, the substrate 210 and the reflector 220 can be integrally formed. For example, the substrate 210 and the reflector 220 can be also formed based on a housing scheme. In some implementations, the substrate 210 and the reflector 220 can be provided by forming a housing with a cavity on an upper portion of the housing and providing a base substrate of the reflector 220 and the substrate 210. In this case, the first lead and the second lead may be exposed through the cavity.

The substrate 210 and the reflector 220 according to the exemplary embodiment of the present disclosure are not limited thereto and other implementation can be also possible.

The light emitting diode 100 can be the same light emitting diode as the light emitting diode 100 according to the embodiments of FIGS. 1 to 9. Therefore, the light emitting diode 100 includes the first electrode 150 covering most or the whole of the underlying structures and a second electrode pad 180 disposed over the first electrode.

The light emitting diode 100 is mounted on the substrate 210, the first electrode 150 can be electrically connected to the first lead 211, and the second electrode pad 180 can be electrically connected to the second lead 213. For example, the light emitting diode 100 can be disposed on the first lead 211, and therefore the first electrode 150 and the first lead 211 can be electrically connected through the contact. Further, the second electrode pad 180 can be electrically connected to the second lead 213 through the wire 260.

Further, the light emitting diode 100 can be mounted on the first lead 211 through a bonding layer 250. As long as the bonding layer 250 can bond the light emitting diode 100 to the first lead 150, various layers can be used for the bonding layer 250. For example, the bonding layer 250 can include a solder, a conductive adhesive, or eutectic bonded AuSn. For example, when the bonding layer 250 includes the solder or the eutectic bonded AuSn, the heat generated during the driving of the light emitting diode can be more efficiently radiated.

As described with reference to FIGS. 1 to 9, the light emitting diode 100 includes the semi-polar or non-polar light emitting structure 120 and has a vertical form including at least one groove 127. The light emitting diode 100 has the relatively reduced efficiency droop and the reduced heat generation during the driving of the light emitting diode. Further, according to the exemplary embodiment of the present disclosure, the light emitting diode 100 is mounted on the first lead 211 and the first electrode 150 formed over most or the whole surface of the light emitting diode 100 contacts with the first lead 211, thereby making the heat sink efficiency excellent while driving the light emitting diode. Therefore, the light emitting device according to the exemplary embodiment of the present disclosure including the light emitting diode 100 can be driven even at a high current. For example, the light emitting device can be driven at a current density which is equal to or greater than 350 mA/mm$^2$. Therefore, defects and damages of the light emitting device due to the heat generation can be prevented while the light emitting device emitting the high power light.

The wavelength conversion unit 240 is disposed on the light emitting diode 100 and is spaced apart from the light emitting diode 100. Further, the wavelength conversion unit 240 can include a multi-layered structure.

Figure 12:
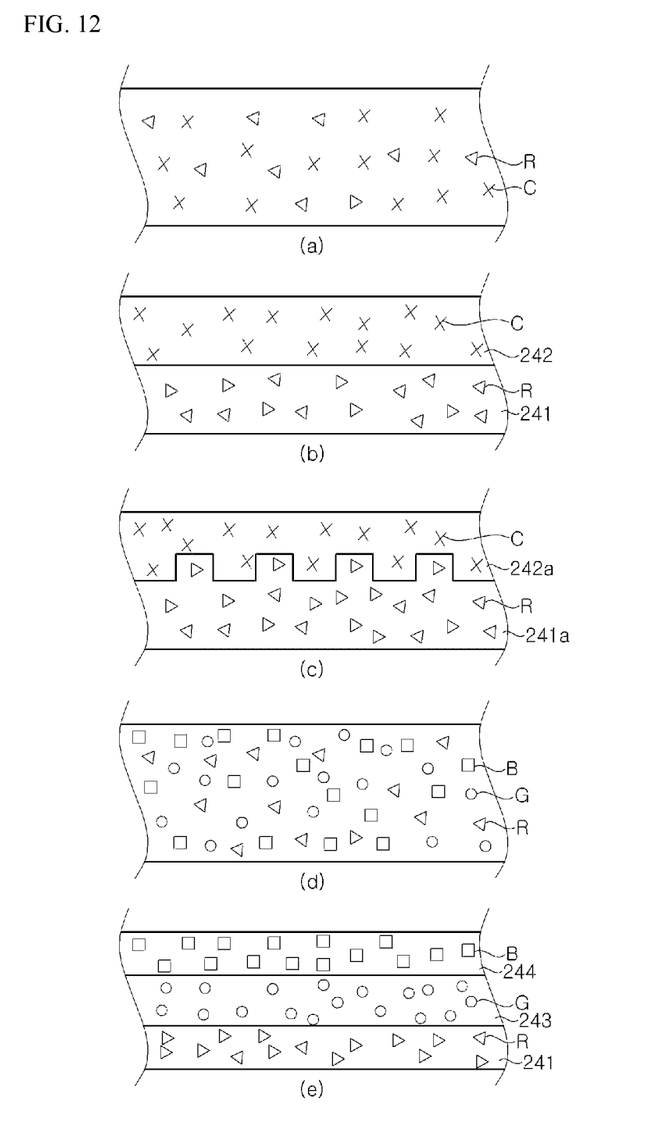
FIG. 12, parts (a) through (3) are enlarged cross-sectional views for describing wavelength conversion units according to some exemplary embodiments of the present disclosure.

The wavelength conversion unit 240 can include various kinds of phosphors. Hereinafter, the wavelength conversion units 240 according to the various exemplary embodiments of the present disclosure will be described with reference to FIGS. 12(a) to 12(e).

Referring to FIG. 12, top figure (a), the wavelength conversion unit 240 can include a red phosphor R and a cyan phosphor C. The red phosphor R and the cyan phosphor C are dipped in resin and thus can be irregularly disposed. The resin can include polymer resin such as epoxy resin and acrylic resin or silicon resin and can serve as a matrix dispersing a phosphor. The red phosphor R and the cyan phosphor C can include various phosphors which are widely known to those skilled in the art and can include at least one of a garnet type phosphor, an aluminate phosphor, a sulfide phosphor, an oxynitride phosphor, a nitride phosphor, a fluoride-based phosphor, or a silicate phosphor. For example, the red phosphor R can include CaAlSiN$_3$:Eu$^{2+}$ and the cyan phosphor C can include M$_2$MgSi$_2$O$_7$:Eu$^{2+}$ (M=at least one selected from Ba, Sr, and Ca). However, the present disclosure is not limited thereto.

Each of the red phosphor R and the cyan phosphor C can perform the wavelength-conversion of ultraviolet light emitted from the light emitting diode 100 into red based light and cyan based light, thereby enabling the light emitting device to emit white light.

The red phosphor can include CaAlSiN$_3$:Eu$^{2+}$ phosphor and further include, for example, SrAlSi$_4$O$_7$:Eu$^{2+}$, M$_2$Si$_5$N$_8$:Eu$^{2+}$ (M includes Ba, Sr or Ca.), MSiN$_2$:Eu$^{2+}$ (M includes Ba, Sr or Ca.), MSi$_2$O$_2$N$_2$:Yb$^{2+}$ (M includes Ba, Sr or Ca.) Y$_2$O$_2$S:Eu$^{3+}$, Sm$^{3+}$, La$_2$O$_2$S:Eu$^{3+}$, Sm$^{3+}$, CaWO$_4$:Li$^{1+}$, Eu$^{3+}$, Sm$^{3+}$, M$_2$SiS$_4$:Eu$^{2+}$ (M includes Ba, Sr or Ca), or LaCuO$_{2-o}$:Eu$^{3+}$, Ba$^{2+}$, etc.

The cyan phosphor can use the M$_2$MgSi$_2$O$_7$:Eu$^{2+}$ (M includes Ba, Sr or Ca.) phosphor and further use, for example, a phosphor using Eu$^{2+}$ for luminescence center such as SrSi$_5$AlO$_2$N$_7$:Eu$^{2+}$, BaSi$_2$O$_2$N$_2$:$^{Eu2+}$, BaAl$_2$O$_4$:Eu$^{2+}$, BaZrSi$_3$O$_9$:Eu$^{2+}$, M$_2$SiO$_4$:Eu$^{2+}$ (M includes Ba, Sr or Ca), M$_2$SiS$_4$:Eu$^{2+}$ (M includes Ba, Sr or Ca). In some implementations, the cyan phosphor can include CaSi$_{12-(m+n)}$Al$_{(m+n)}$O$_n$N$_{16-n}$:Ce$^{3+}$ etc.

Referring to FIG. 12, second from the top figure (b), the wavelength conversion unit 240 can include a first phosphor layer 241 including the red phosphor R and a second phosphor layer 242 which is disposed on the first phosphor layer 241 and includes the cyan phosphor C.

In each of the phosphor layers 241 and 242, the red phosphor R and the cyan phosphor C are dipped in resin and thus can be irregularly disposed. The ultraviolet light emitted from the light emitting diode is converted into the red based light by the first phosphor layer 241 and is converted into the cyan based light by the second phosphor layer 242. The red based light has a wavelength longer than that of the cyan based light, and therefore the light converted by the first phosphor layer 241 can be prevented from being again converted by the second phosphor layer 242. Therefore, it is possible to prevent the unwanted wavelength conversion from being generated within the wavelength conversion unit 240.

Further, the wavelength conversion unit 240 is formed to have multi layers including the first phosphor layer 241 and the second phosphor layer 242, thereby solving the uniformity of light due to polarization characteristics of the light emitted from the light emitting diode 100. Describing in detail, the light emitted from the light emitting diode 100 has the polarization characteristics by the semi-polar or non-polar characteristics of the light emitting structure 120 as described above. According to the exemplary embodiment of the present disclosure, the polarized light is primarily wavelength-converted by the first phosphor layer 241 and is secondarily wavelength-converted by the second phosphor layer 242 disposed on the first phosphor layer 241, such that it is possible to prevent the emitted light from being non-uniform due to the reflectance changed depending on the polarization characteristics.

Referring to FIG. 12, third from the top figure (c), the wavelength conversion unit 240 is generally similar to the case of FIG. 12, second from the top figure (b) but is different from the FIG. 12, second from the top figure (b) in that the first phosphor layer 241a includes a plurality of protrusions and depressions. The first phosphor layer 241a includes the protrusions and the depressions to prevent light from being scattered and reflected at an interface between the first phosphor layer 241a and the second phosphor layer 242a. Therefore, the light emitting efficiency of the light emitting device can be improved.

Referring to FIG. 12, fourth from the top (d), the wavelength conversion unit 240 can include the red phosphor R, a green phosphor G, and a blue phosphor B. The red phosphor R, the green phosphor G, and the blue phosphor B are dipped in resin and thus can be irregularly disposed. The resin can include polymer resin like epoxy resin or acrylic resin or silicon resin and can serve as a matrix dispersing a phosphor. The red phosphor R, the green phosphor G, or the blue phosphor B can include various phosphors which are widely known to those skilled in the art and can include, for example, at least one of a garnet type phosphor, an aluminate phosphor, a sulfide phosphor, an oxynitride phosphor, a nitride phosphor, a fluoride-based phosphor, or a silicate phosphor. However, the present disclosure is not limited thereto.

Each of the red phosphor R, the green phosphor G, and the blue phosphor B can perform the wavelength-conversion of ultraviolet light emitted from the light emitting diode 100 into red based light, red based light, and blue based light, thereby enabling the light emitting device to emit white light.

Referring to FIG. 12, bottom figure (e), the wavelength conversion unit 240 can include the first phosphor layer 241 including the red phosphor R, a third phosphor layer 243 including the green phosphor G, and a fourth phosphor layer 244 including the blue phosphor B.

In each of the phosphor layers 241, 243, and 244, the phosphors R, G, and B are dipped in resin and thus can be irregularly disposed. The ultraviolet light emitted from the light emitting diode is converted into the red based light by the first phosphor layer 241, is converted into the green based light by the third phosphor layer 243, and is converted into the blue based light by the fourth phosphor layer 244. The red based light has a wavelength longer than that of the green based light and the green based light has a wavelength longer than that of the blue based light. Thus, it is possible to prevent the light converted by the first phosphor layer 241 from being again converted by the third phosphor layer 243 and/or the fourth phosphor layer 244 and the light converted by the third phosphor layer 243 from being again converted by the fourth phosphor layer 244. Therefore, it is possible to prevent the unwanted wavelength conversion from being generated within the wavelength conversion unit 240.

In some implementations, the wavelength conversion unit 240 is formed to have a multi-layered structure including the first phosphor layer 241, the third phosphor layer 243, and the fourth phosphor layer 244, to thereby solve or address the uniformity of light depending on the polarization characteristics of the light emitted from the light emitting diode 100.

Meanwhile, the first phosphor layer 241 and the third phosphor layer 243 each can also include a plurality of protrusions and depressions (not illustrated) formed on the upper surfaces thereof. In this case, it is possible to prevent the light generated at the interface between the phosphor layers from being reflected.

The exemplary embodiment of the present disclosure includes foregoing various types of wavelength conversion units 240, thereby improving the light uniformity of the light emitting device. Therefore, when the light emitting device is applied to the lighting purpose, the lighting device having excellent light emitting characteristics can be provided.

Referring back to FIG. 10, the wavelength conversion unit 240 can be spaced apart from the light emitting diode 100. The wavelength conversion unit 240 and the light emitting diode 100 are spaced apart from each other by a predetermined distance, and thus it is possible to prevent the wavelength conversion unit 240 from being damaged due to the heat generated during the driving of the light emitting diode 100. In particular, since the light emitting diode 100 according to the exemplary embodiment of the present disclosure is driven at a high density current which is equal to or greater than 350 mA/mm$^2$ and has a large degree of heat generation, the wavelength conversion unit 240 is spaced apart from the light emitting diode 100 to effectively prevent the wavelength conversion unit 240 from being damaged due to heat.

In this case, a spaced distance D between the light emitting diode 100 and the wavelength conversion unit 240 can be 0.5 to 5.0 times as great as a thickness T of the light emitting diode 100. That is, the relationship of $D=(0.5\sim5.0)\times T$ can be established.

Meanwhile, the wavelength conversion unit 240 can also be formed by a molding method and can also be provided by disposing the wavelength conversion unit 240 having a ready-made plate form such as a ceramic plate or a phosphor sheet on the light emitting diode 100.

When the wavelength conversion unit 240 is formed by the molding scheme, prior to forming the wavelength conversion unit 240, the encapsulation unit 230 encapsulating the light emitting diode 100 can be additionally formed. The encapsulation unit 230 has light transmittance and can be formed to encapsulate the light emitting diode 100 using a molding or dotting method. The wavelength conversion unit 240 can be formed on the encapsulation unit 230 and can be formed by any available molding method. Further, the wavelength conversion unit 240 can be formed by a plurality of molding processes. In this case, the wavelength conversion unit 240 having a multi-layered structure can be provided. For example, the wavelength conversion unit 240 having the structure illustrated in FIG. 12(b), 12(c), or 12(e) can be provided by the plurality of molding processes.

The disposing of the wavelength conversion unit 240 having the plate formed on the light emitting diode 100 can include positioning the wavelength conversion unit 240 on the encapsulation unit 230. In this case, an adhesive can be further interposed between the encapsulation unit 230 and the wavelength conversion unit 240. In this case, the wavelength conversion unit 240 is separately made from the light emitting device.

Figure 11:
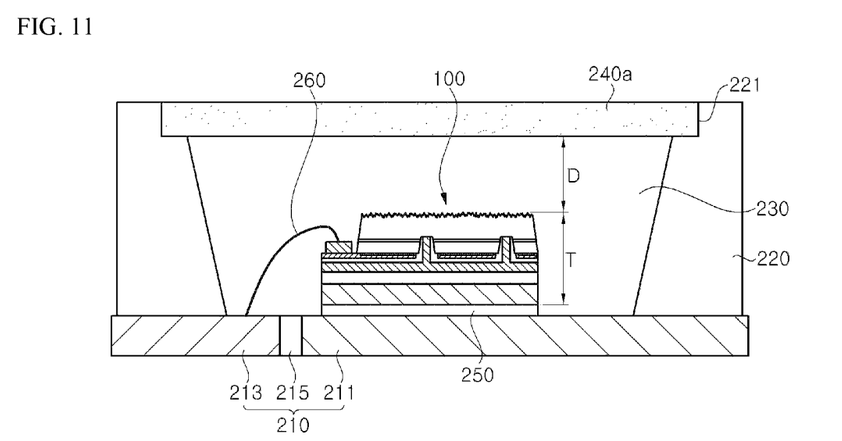
FIG. 11 is a cross-sectional view describing an exemplary light emitting device according to some exemplary embodiments of the present disclosure.

In some implementations, as illustrated in FIG. 11, the wavelength conversion unit 240a can be disposed to be seated in the reflector 220.

Referring to FIG. 11, the wavelength conversion unit 240a has a plate form and is spaced apart from the light emitting diode 100 while being supported by the reflector 220. In this case, the reflector 220 can further include an stepped portion 221 formed on a side thereof to stably support the wavelength conversion unit 240a. In the case of the light emitting device as illustrated in FIG. 11, the encapsulation unit 230 can also be omitted.

Figure 13:
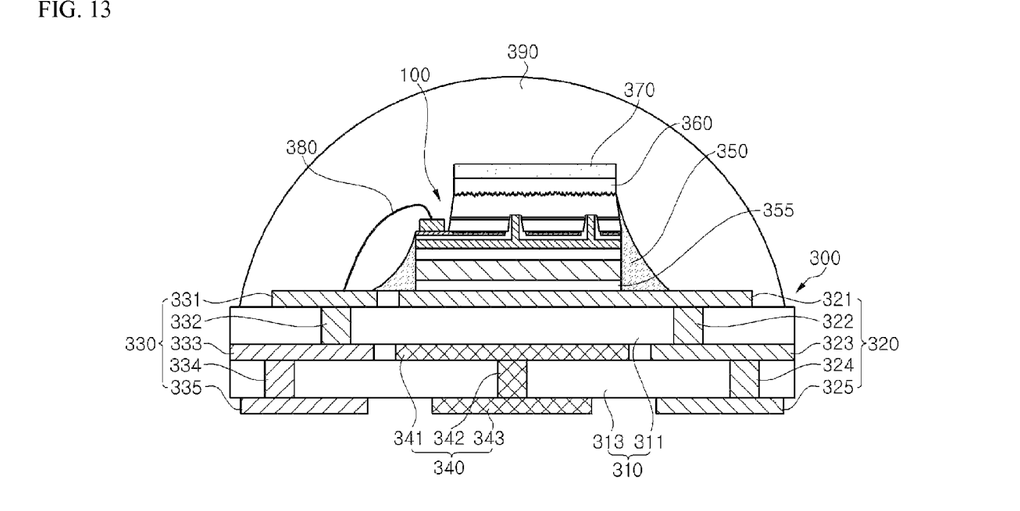
FIG. 13 is a cross-sectional view for describing an exemplary light emitting device according to some exemplary embodiments of the present disclosure.

FIG. 13 is a cross-sectional view for describing a light emitting device according to some exemplary embodiments of the present disclosure.

The light emitting device can be provided by preparing the light emitting diode 100, mounting the light emitting diode 100 on a substrate 300, forming a resin part 350 covering the side of the light emitting diode 100, and forming a wavelength conversion unit 370 spaced apart from the light emitting diode 100. Hereinafter, each component or element and a manufacturing method will be described below in detail.

The light emitting device includes the substrate 300, the light emitting diode 100, and the wavelength conversion unit 370. Further, the light emitting device can further include the resin part 350, an encapsulation unit 390, a bonding layer 355, and a wire 380.

The substrate 300 can include an insulating substrate 310, a first lead 320, and a second lead 330 and can further include a heat sink lead 340. The insulating substrate 310 can include an upper insulating substrate 311 and a lower insulating substrate 313. The first lead 320 can include a first upper conductive pattern 321, a first upper via 322, a first intermediate conductive pattern 323, a first lower via 324, and a first lower conductive pattern 325. The second lead 330 can include a second upper conductive pattern 331, a second upper via 332, a second intermediate conductive pattern 333, a second lower via 334, and a second lower conductive pattern 335. The heat sink lead 340 can include an upper heat sink pattern 341, a heat sink via 342, and a lower heat sink pattern 343. Hereinafter, components and structure of the substrate 300 will be described in detail with reference to the drawings.

Referring to the drawings, the upper insulating substrate 311 and the lower insulating substrate 313 can be disposed in a vertically stacked form. The upper insulating substrate 311 and the lower insulating substrate 313 can include an insulating material and can include a material having high heat conductivity. For example, the upper insulating substrate 311 and the lower insulating substrate 313 can include a high heat conductive polymer material and/or a ceramic material.

The first upper conductive pattern 321 and the second upper conductive pattern 331 can be disposed on the upper insulating substrate 311, being spaced apart from each other. The first upper conductive pattern 321 can provide a region in which the light emitting diode 100 is mounted and can be electrically connected to the first electrode 150 of the light emitting diode 100. The second upper conductive pattern 331 can be electrically connected to the second electrode pad 180 of the light emitting diode 100 through the wire 380. Meanwhile, an insulating material can be further formed in a spaced region between the first and second upper conductive patterns 321 and 331.

The first intermediate conductive pattern 323 and the second intermediate conductive pattern 333 can be positioned under the upper insulating substrate 311, and therefore can be interposed between the upper insulating substrate 311 and the lower insulating substrate 313. The first intermediate conductive pattern 323 and the second intermediate conductive pattern 333 are electrically connected to the first upper conductive pattern 321 and the second upper conductive pattern 331 through the first upper via 322 and the second upper via 332 penetrating the upper insulating substrate 311.

The upper heat sink pattern 341 can be disposed between the upper insulating substrate 311 and the lower insulating substrate 313. The upper heat sink pattern 341 can be electrically insulated, being spaced apart from the first intermediate conductive pattern 323 and the second intermediate conductive pattern 333. Further, an insulating material can be further formed in the region in which the upper heat sink pattern 341, the first intermediate conductive pattern 323, and the second intermediate conductive pattern 333 are spaced apart from one another. Further, the upper heat sink pattern 341 can be disposed between the first and second intermediate conductive patterns 323 and 333.

In some implementations, the upper heat sink pattern 341 can be disposed under the light emitting diode 100 and thus the heat generated during the operation of the light emitting diode 100 is effectively conducted to the upper heat sink pattern 341, thereby improving the heat dissipation efficiency of the light emitting diode 100.

The first lower conductive pattern 325 and the second lower conductive pattern 335 can be disposed under the lower insulating substrate 313. The first lower conductive pattern 325 and the second lower conductive pattern 335 are electrically connected to the first intermediate conductive pattern 323 and the second intermediate conductive pattern 333 through the first lower via 324 and the second lower via 334 penetrating the lower insulating substrate 313.

Therefore, the first lower conductive pattern 325 and the second lower conductive pattern 335 are electrically connected to the first upper conductive pattern 321 and the second upper conductive pattern 331. For example, when the light emitting device is mounted on an additional substrate (for example, printed circuit board), the first lower conductive pattern 325 and the second lower conductive pattern 335 can be connected to an external power supply to serve to supply power to the light emitting diode 100.

The lower heat sink pattern 343 can be disposed under the lower surface of the lower insulating substrate 313. The lower heat sink pattern 343 can be electrically insulated, being spaced apart from the first lower conductive pattern 325 and the second lower conductive pattern 335. Further, the lower heat sink pattern 343 can be connected to the upper heat sink pattern 341 through the heat sink via 342 and thus the heat conducted to the upper heat sink pattern 341 can be conducted to the lower heat sink pattern 343 through the heat sink via 342. In some implementations, the heat sink via 342 is disposed to vertically penetrate through the lower insulating substrate 313 and the lower heat sink pattern 343 can be disposed under the upper heat sink pattern 341. Further, the lower heat sink pattern 343 can be disposed between the first and second lower conductive patterns 325 and 335.

The heat sink lead 340 can serve similar to the heat sink to effectively radiate the heat generated during the operation of the light emitting diode 100. For example, when the light emitting device is mounted on the additional substrate (for example, printed circuit board), the heat sink lead 340, for example, the lower heat sink pattern 343 can be connected to the heat sink member of the additional substrate.

The first lead 320 and the second lead 330 can include a material having excellent electric conductivity and for example, can be formed by depositing and/or plating a metal material such as Ni, Pt, Pd, Rh, W, Ti, Al, Ag, Au, or Cu. For example, the first and second upper conductive patterns 321 and 331 can include the high reflective material in addition to the electric conductivity and can include, for example, Au, Al, or Ag, etc. The heat sink lead 340 can include a material having excellent heat conductivity, for example, a metal material such as W and Au. However, the present disclosure is not limited thereto.

The light emitting diode 100 can be the same light emitting diode as the light emitting diode 100 according to the embodiments of FIGS. 1 to 9. Therefore, the light emitting diode 100 includes the first electrode 150 covering most or the whole of the lower surface of the underlying structure and a second electrode pad 180 disposed over the first electrode 150.

The light emitting diode 100 can be mounted on the first lead 320, the first electrode 150 can be electrically connected to the first upper conductive pattern 321, and the second electrode pad 180 can be electrically connected to the second upper conductive pattern 331.

The light emitting diode 100 can be mounted on the first lead 320 through a bonding layer 355. As long as the bonding layer 355 can bond the light emitting diode 100 to the first lead 320, any layer can be used for the bonding layer 355. For example, the bonding layer 355 can include a solder, a conductive adhesive, or eutectic bonded AuSn. When the bonding layer 355 includes the solder or the eutectic bonded AuSn, the heat generated during the driving of the light emitting diode can be more efficiently emitted.

The resin part 350 can cover at least a part of the side of the light emitting diode 100.

The resin part 350 can include at least one of polymer resin such as epoxy resin, acrylic resin, or imide resin or silicon resin and can also have light transmitting, semi-transmitting, or light reflective properties. Further, the resin part 350 can further include a diffuser, etc., to scatter light. The resin part 350 can be provided by applying resin on the side of the light emitting diode 100 and hardening the resin and can also use a mask to form the resin part 350 at the desired position.

When the resin part 350 has the light transmitting property, the resin part 350 can include the diffuser and a refractive index of the resin part 350 can be lower than that of the nitride semiconductor layer. It is possible to reduce the probability of total reflection of light from an outer surface of the light emitting diode to the inside of the light emitting diode. Further, when the resin part 350 is made of or includes a light transmitting material including the diffuser, a ratio of photons directed toward the side can be increased and therefore a directional distribution of the light emitting device can be wide. Meanwhile, with the light reflective property, the resin part 350 can serve to reflect the light emitted from the light emitting diode 100 upward. Therefore, the characteristics of the resin part 350 can be controlled in consideration of the direction characteristics, etc., which are desired by the light emitting device.

Further, the outer side of the resin part 350 can be tilted as illustrated. However, the side of the resin part 350 can be inclined to effectively reflect the totally reflected light from the encapsulation unit 390 and the interface with the outside into the inside of the light emitting device, thereby improving the light emitting efficiency of the light emitting device.

A material and form of the resin part 350 of the present disclosure are not limited the descriptions above and other implementations are also possible.

The wavelength conversion unit 370 is disposed on the light emitting diode 100 and is spaced apart from the light emitting diode 100. In this case, the light transmitting layer 360 can be further disposed between the light emitting diode 100 and the wavelength conversion unit 370 so that the wavelength conversion unit 370 is spaced apart from the light emitting diode 100.

The wavelength conversion unit 370 is substantially similar to the wavelength conversion unit 240 described with reference to FIG. 10 and therefore the detailed description thereof will be omitted.

The light transmitting layer 360 can include a material which has light transmitting property and has a refractive index lower than that of the nitride semiconductor layer and a refractive index higher than that of the wavelength conversion unit 370. As such, the light transmitting layer 360 performs a similar role to a refractive index grading layer between the wavelength conversion unit 370 and the light emitting diode 100 and can reduce the probability that light is totally reflected at each interface. For example, the light transmitting layer 360 can include a material such as $SiO_2$ and $SiN_x$ and can further include the diffuser, etc.

Figure 14:
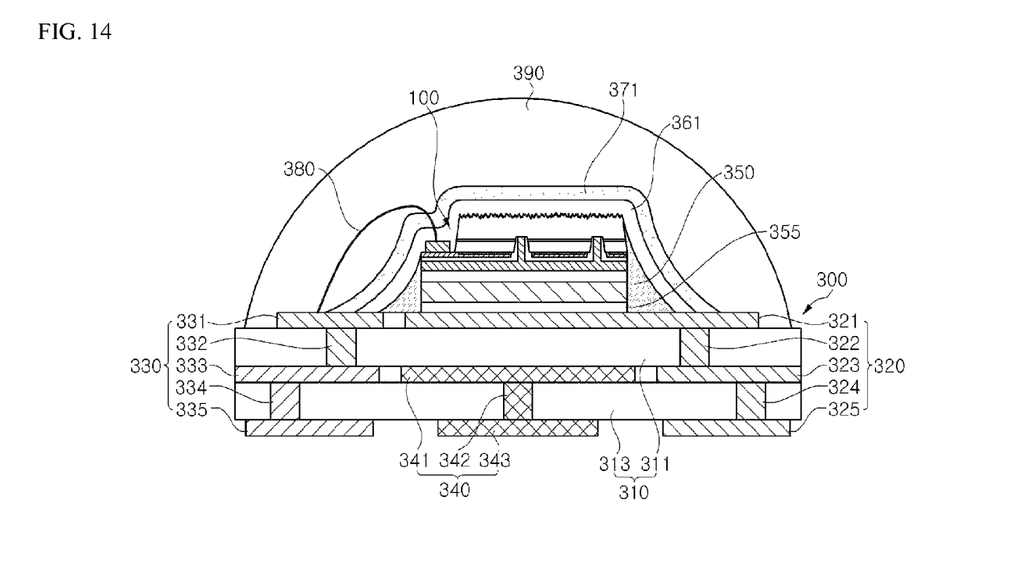
FIG. 14 is a cross-sectional view for describing an exemplary light emitting device according to some exemplary embodiments of the present disclosure.

As such, the light emitting diode 100 and the wavelength conversion unit 370 can be spaced apart from each other by a predetermined distance by the light transmitting layer 360 and therefore the thickness of the light transmitting layer 360 corresponds to the spaced distance between the light emitting diode 100 and the wavelength conversion unit 370. In this case, the thickness of the light transmitting layer 360 (spaced distance between the light emitting diode 100 and the wavelength conversion unit 370) can be 0.5 to 5.0 times as great as the thickness of the light emitting diode 100. The exemplary embodiment of the present disclosure describes that the wavelength conversion unit 370 and the light transmitting layer 360 are disposed on the first conductive-type semiconductor layer 121 but is not limited thereto. As illustrated in FIG. 14, the wavelength conversion unit 371 and the light transmitting layer 361 can also be formed to generally cover the overall light emitting diode 100. Referring to FIG. 14, the light transmitting layer 361 can cover the light emitting diode 100 and further cover the resin part 350. The wavelength conversion unit 371 can be formed on the light transmitting layer 361.

The light transmitting layer 361 is formed to generally cover the overall light emitting diode 100 to protect the light emitting diode 100 from the outside. Further, the wavelength conversion unit 371 is formed on the light transmitting layer 361 to allow most of the light emitted from the light emitting diode 100 to be incident on the wavelength conversion unit 371. Therefore, the ultraviolet light emitted from the light emitting diode 100 can be prevented from being emitted to the outside without the wavelength-conversion by the wavelength conversion unit 371. Thus, most of the ultraviolet light goes through the wavelength conversion unit 371, which increases a quantity of visible ray emitted from the light emitting device.

Referring back to FIG. 13, the encapsulation unit 390 can be formed on the substrate 300 to encapsulate the light emitting diode 100. The encapsulation unit 390 can be formed by molding or dotting polymer or silicon resin.

According to the exemplary embodiment of the present disclosure, the light emitting device to which the light emitting diode including the light emitting structure having the semi-polar or non-polar characteristics is applied is provided. According to the exemplary embodiments of the present disclosure, it is possible to provide the light emitting device which is driven at the current density which is equal to or greater than of 350 mA/mm$^2$ by improving the efficiency droop and the heat generation of the light emitting diode. Further, in some implementations, the disclosed light emitting device has the excellent reliability by effectively preventing the wavelength conversion unit by preventing the light emitting diode from being damaged. Further, in some implementations, the disclosed light emitting device has the excellent light emitting characteristics by uniformly emitting the white light.

According to the exemplary embodiments of the present disclosure, it is possible to provide the light emitting device which is driven at the high current density by improving the efficiency drop and the heat generation of the light emitting diode. Further, In some implementations, the disclosed light emitting device has the excellent reliability by effectively preventing the wavelength conversion unit by preventing the light emitting diode from being damaged. Further, in some implementations, the disclosed light emitting device has the excellent light emitting characteristics by uniformly emitting the white light.

Hereinabove, various exemplary embodiments of the present disclosure are described, but the present disclosure is not limited to the foregoing exemplary embodiments and features and can be variously modified and changed without departing from the technical spirit defined by the claims of the present disclosure.

What is claimed is:

1. A light emitting device, comprising:
a substrate including a first lead and a second lead;
a light emitting diode disposed over the first lead of the substrate, the light emitting diode including a light emitting structure including an active layer, a first conductive-type semiconductor layer disposed over the active layer, and a second conductive type semiconductor layer, the active layer disposed over the second conductive-type semiconductor layer, wherein the light emitting diode is configured to emit near ultraviolet light; and
a wavelength conversion unit disposed over the light emitting diode,
wherein the light emitting diode includes:
at least one groove formed in the light emitting structure and exposing a portion of the first conductive-type semiconductor layer;
a first electrode disposed under the light emitting structure and electrically connected to the first conductive-type semiconductor layer exposed by the at least one groove; and
a second electrode disposed under a lower surface of the second conductive-type semiconductor layer and at least partially covered by the second conductive-type semiconductor layer, and
wherein the light emitting diode has a semi-polar or non-polar growth surface,
the wavelength conversion unit includes a multi-layered structure including a first phosphor layer and a second phosphor layer disposed over the first phosphor layer, and
the light emitting diode is configured to be driven at a current density equal to or greater than 350 mA/mm$^2$.

2. The light emitting device of claim 1, wherein the first conductive-type semiconductor layer, the second conductive-type semiconductor layer, and the active layer include a nitride based semiconductor layer and the nitride based semiconductor layer has a growth surface including an m-plane, an a-plane, or a semi-polar crystal plane.

3. The light emitting device of claim 1, wherein the light emitting diode further includes a second electrode pad disposed over a region of the second electrode not covered by the second conductive-type semiconductor layer.

4. The light emitting device of claim 3, wherein the first electrode is electrically connected to the first lead and the second lead is electrically connected to the second electrode pad.

5. The light emitting device of claim 1, wherein the second electrode includes a reflective layer and a cover layer covering the reflective layer, and
a part of the second electrode not covered by the second conductive-type semiconductor layer forms a part of the cover layer.

6. The light emitting device of claim 1, wherein the light emitting diode is configured to emit light having a peak wavelength which ranges from 380 to 420 nm.

7. The light emitting device of claim 1, wherein the first phosphor layer includes a red phosphor and the second phosphor layer includes a cyan phosphor.

8. The light emitting device of claim 7, wherein the first phosphor layer has an upper surface including a plurality of protrusions and depressions.

9. The light emitting device of claim 1, wherein the wavelength conversion unit further includes a third phosphor layer disposed over the second phosphor layer, and the first, second and third phosphor layers include a red phosphor, a green phosphor, and a blue phosphor, respectively.

10. The light emitting device of claim 9, wherein the first phosphor layer, the second phosphor layer, or both of the first and second phosphor layers include a plurality of protrusions and depressions formed on an upper surface thereof.

11. The light emitting device of claim 1, further including:
a reflector disposed over the substrate and surrounding a side of the light emitting diode,
wherein the wavelength conversion unit has a plate shape and is supported by the reflector.

12. The light emitting device of claim 1, wherein the wavelength conversion unit is spaced apart from the light emitting diode by a distance that is 0.5 to 5.0 times a thickness of the light emitting diode.

13. The light emitting device of claim 1, further including:
an encapsulation unit covering the light emitting diode,
wherein the wavelength conversion unit is disposed over the encapsulation unit.

14. The light emitting device of claim 1, wherein the substrate further includes an upper insulating substrate and a lower insulating substrate,
the first lead includes a first upper conductive pattern, a first intermediate conductive pattern, a first lower conductive pattern, a first upper via, and a first lower via,
the second lead includes a second upper conductive pattern, a second intermediate conductive pattern, a second lower conductive pattern, a second upper via, and a second lower via,
the first upper conductive pattern and the second upper conductive pattern are disposed over the upper insulating substrate and being spaced apart from each other,
the first intermediate conductive pattern and the second intermediate conductive pattern are interposed between the upper insulating substrate and the lower insulating substrate and being spaced apart from each other,
the first upper via and the first lower via penetrate through the upper insulating substrate and the lower insulating substrate, respectively, to form an electrical connection among the first upper conductive pattern, the first intermediate conductive pattern, and the first lower conductive pattern, and
the second upper via and the second lower via penetrate through the upper insulating substrate and the lower insulating substrate, respectively, to form an electrical connection among the second upper conductive pattern, the second intermediate conductive pattern, and the second lower conductive pattern.

15. The light emitting device of claim 14, wherein the substrate further includes a heat sink lead,
the heat sink lead includes an upper heat sink pattern, a lower heat sink pattern, and a heat sink via, and
the upper heat sink pattern is interposed between the upper insulating substrate and the lower insulating substrate, the lower heat sink pattern is disposed under the lower surface of the lower insulating substrate, and the heat sink via penetrates through the lower insulating substrate to form a thermal connection between the upper heat sink pattern and the lower heat sink pattern.

16. The light emitting device of claim 14, further including:
a resin unit covering a side of the light emitting diode.

17. The light emitting device of claim 14, further including:
  a light transmitting layer at least partially covering the light emitting diode,
  wherein the wavelength conversion unit is disposed over the light transmitting layer and spaced apart from the light emitting diode.

18. The light emitting device of claim 1, wherein the at least one groove has an inclined side.

19. The light emitting device of claim 3, wherein the first electrode is disposed under the light emitting structure and extends under the second electrode pad.

20. The light emitting device of claim 1, further including an insulating layer disposed between first electrode and the second electrode.

* * * * *